United States Patent
Morita et al.

(10) Patent No.: US 8,262,970 B2
(45) Date of Patent: Sep. 11, 2012

(54) SEMICONDUCTOR DEVICE AND METHOD OF MANUFACTURING THEREOF

(75) Inventors: Yoshitsugu Morita, Ichihara (JP); Junji Nakanishi, Sodegaura (JP); Katsutoshi Mine, Ichihara (JP)

(73) Assignee: Dow Corning Toray Company, Ltd., Chiyoda-ku, Tokyo (JP)

( * ) Notice: Subject to any disclaimer, the term of this patent is extended or adjusted under 35 U.S.C. 154(b) by 1400 days.

(21) Appl. No.: 10/599,041

(22) PCT Filed: Mar. 8, 2005

(86) PCT No.: PCT/JP2005/004410
§ 371 (c)(1),
(2), (4) Date: Jul. 10, 2007

(87) PCT Pub. No.: WO2005/091361
PCT Pub. Date: Sep. 29, 2005

(65) Prior Publication Data
US 2007/0273050 A1 Nov. 29, 2007

(30) Foreign Application Priority Data
Mar. 19, 2004 (JP) ................. 2004-079597

(51) Int. Cl.
*H01L 23/29* (2006.01)
*H01L 21/56* (2006.01)
(52) U.S. Cl. .......... 264/272.17; 264/271.11; 264/272.11
(58) Field of Classification Search ............. 264/272.17, 264/271.1, 27, 272.11; 257/788
See application file for complete search history.

(56) References Cited

U.S. PATENT DOCUMENTS
| 6,458,628 | B1 | 10/2002 | Distefano et al. |
| 6,743,389 | B2 | 6/2004 | Miyajima et al. |
| 2002/0015748 | A1 | 2/2002 | Miyajima et al. |

FOREIGN PATENT DOCUMENTS
| EP | 0352493 A1 | 1/1990 |
| EP | 0997498 A1 | 10/1998 |
| EP | 0939101 A2 | 9/1999 |
| JP | 8244064 | 9/1996 |
| JP | 11077733 | 3/1999 |
| JP | 2000277551 | 10/2000 |

OTHER PUBLICATIONS

English language abstract for JP8244064 extracted from espacenet.com database Jan. 18, 2007.
English language abstract for JP11077733 extracted from espacenet.come database Jan. 18, 2007.
English language abstract for JP2000277551 extracted from espacenet.come database Jan. 18, 2007.

*Primary Examiner* — Christina Johnson
*Assistant Examiner* — Saeed Huda
(74) *Attorney, Agent, or Firm* — Howard & Howard Attorneys PLLC

(57) ABSTRACT

A method of manufacturing a semiconductor device sealed in a cured silicone body by placing an unsealed semiconductor device into a mold and subjecting a curable liquid silicone composition that fills the spaces between the mold and the unsealed semiconductor device to compression molding under a predetermined molding temperature, wherein said curable liquid silicone composition has viscosity of 90 Pa·s or less at room temperature, a time interval from the moment directly after measurement of a torque with a curometer at the molding temperature to the moment when the torque reached 1 kgf·cm is not less than 1 min., while the time interval during which the torque grows from 1 kgf·cm to 5 kgf·cm is not more than 1 min.

9 Claims, 4 Drawing Sheets

US 8,262,970 B2

SEMICONDUCTOR DEVICE AND METHOD OF MANUFACTURING THEREOF

RELATED APPLICATIONS

This application claims priority to and all the advantages of International Patent Application No. PCT/JP2005/004410, filed on Mar. 8, 2005, which claims priority to Japanese Patent Application No. JP2004-079597, filed on Mar. 19, 2004.

TECHNICAL FIELD

This invention relates to a method of manufacturing a semiconductor device and to a semiconductor device produced by the method.

BACKGROUND ART

Sealing of semiconductor devices is carried out with the use of a transfer-molding with a metal mold, potting with a liquid sealing resin, or screen-printing with a liquid sealing resin. The recent trend towards miniaturization of semiconductor devices demands that electronic devices be smaller in size, thinner in thickness, and allow resin sealing of packages as thin as 500 μm or thinner.

If a transfer-molding is employed in resin sealing of thin packages, the thickness of the sealing resin could be precisely controlled, whereas there are problems that vertical displacements of semiconductor chips occur in a flow of a liquid sealing resin, or breakage of wires and contact between the wires occur because of deformations of bonding wires connected to semiconductor chips under the effect of pressure in the flow of the liquid sealing resin.

On the other hand, although potting or screen-printing with a liquid sealing resin to some extent protects the bonding wires from breakage and mutual contact, these methods make accurate control of sealing-resin coatings more difficult and can easily lead to formation of voids.

It was proposed to solve the above problems and to manufacture a resin-sealed semiconductor device by placing an unsealed semiconductor device into a mold, filling spaces between the semiconductor device and the mold with a moldable resin, and curing the resin by using compression-molding (see Japanese Laid-Open Patent Application Publication (Kokai) (hereinafter referred to as "Kokai") Hei 8-244064, Kokai Hei 11-77733, and Kokai 2000-277551).

However, due to thinning of semiconductor chips that occurs with miniaturization of semiconductor elements, these methods increase warping of the semiconductor chips and printed-circuit boards and may lead to damaging of semiconductor devices and to worsening of their performance characteristics.

It is an object of the present invention to provide a method for efficient manufacturing of sealed semiconductor devices that prevent formation of voids in the sealing material and reduce warping of semiconductor chips and printed-circuit boards, which in case of sealing with a curable liquid silicone composition, can be sealed quickly and with adequate moldability. It is another object to provide sealed semiconductor devices with the aforementioned properties.

DISCLOSURE OF INVENTION

The invention provides a method of manufacturing a semiconductor device sealed in a cured silicone body by placing an unsealed semiconductor device into a mold and subjecting a curable liquid silicone composition that fills the spaces between the mold and the unsealed semiconductor device to compression molding under a predetermined molding temperature, wherein the curable liquid silicone composition has viscosity of 90 Pa·s or less at room temperature, and wherein a time interval from the moment directly after measurement of a torque with a curometer at the molding temperature to the moment when the torque reached 1 kgf·cm being not less than 1 min., while the time interval during which the torque is increased from 1 kgf·cm to 5 kgf·cm being not more than 1 min.

In addition, the invention also provides a semiconductor device produced by the aforementioned method.

EFFECTS OF INVENTION

The method of the invention provides efficient manufacturing of sealed semiconductor devices that prevent formation of voids in the sealing material and reduce warping of semiconductor chips and printed-circuit boards, which in case of sealing with a curable liquid silicone composition, can be sealed quickly and with adequate moldability. Furthermore, the invention provides sealed semiconductor device that possess the aforementioned properties.

Figure 1:
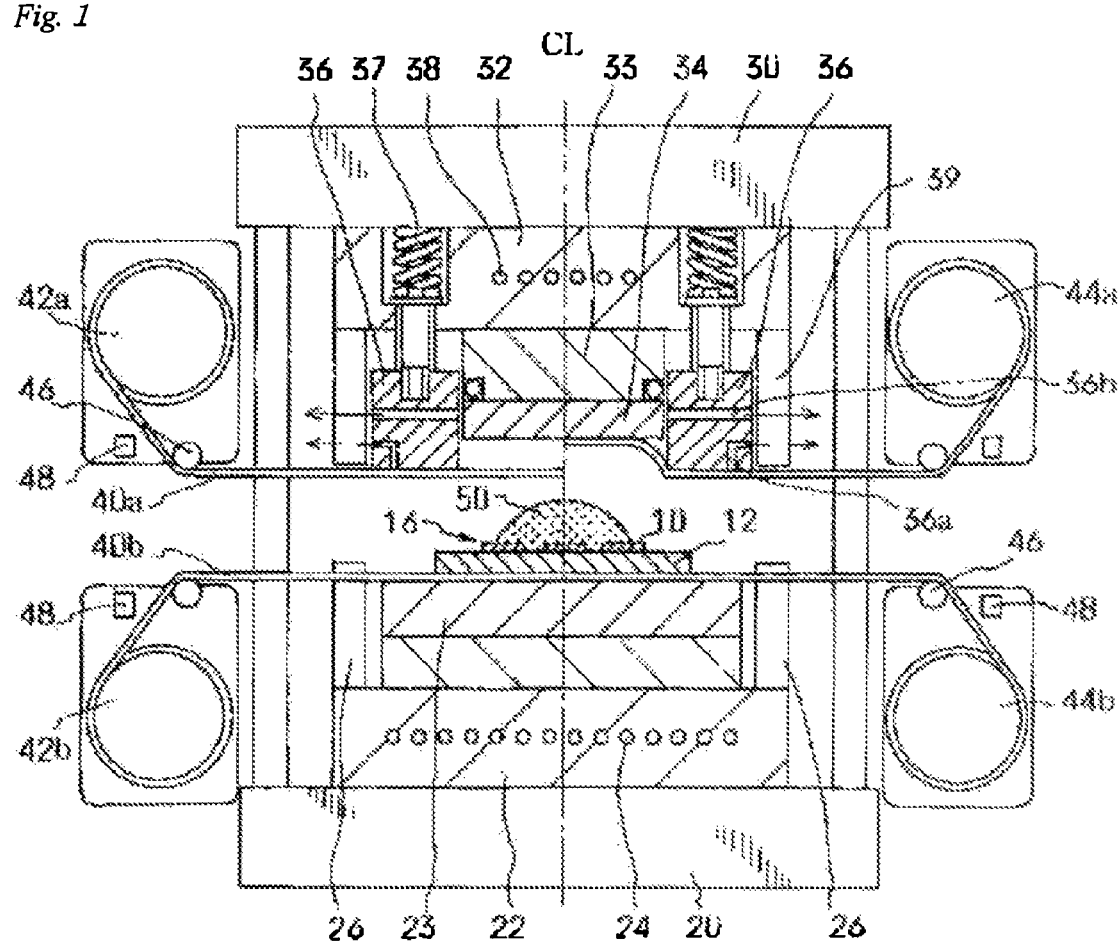
FIG. 1 illustrates main structural units of compression molding machine suitable for realization of the method of the present invention.

| Reference numbers | |
|---|---|
| 10: | semiconductor chip |
| 12: | printed-circuit board |
| 14: | cured silicone body |
| 16: | semiconductor device |
| 20: | fixed platen |
| 22: | lower base |
| 23: | lower mold |
| 24: | heater |
| 26: | lower clamp stopper |
| 30: | movable platen |
| 32: | upper base |
| 33: | upper holder |
| 34: | upper mold |
| 34a: | recess of the cavity |
| 36: | clamper |
| 36a, 36b: | air ports |
| 37: | spring |
| 38: | heater |
| 39: | upper clamp stopper |
| 40a, 40b: | release films |
| 42a, 42b: | feed rollers |

| Reference numbers | |
|---|---|
| 44a, 44b: | take-up rollers |
| 46: | guide roller |
| 48: | static charge remover |
| 50: | curable liquid silicone composition |
| 70: | semiconductor device sealed with a cured silicone body |
| 72: | cured silicone body |

DETAILED DESCRIPTION OF THE INVENTION

Let us first consider in more detail a method of the invention for manufacturing sealed semiconductor devices.

According to the proposed method, a semiconductor device is placed into a mold and is then sealed in a cured silicone body by filling spaces between the mold and the semiconductor device with a curable liquid silicone composition and subjecting the composition to compression molding at a predetermined molding temperature. A compression molding machine that contains the aforementioned mold may be represented by a conventional compression molding machine comprised: an upper mold and a lower mold between which a semiconductor device can be clamped and a curable liquid silicone composition can be fed for filling the cavities between the mold and the semiconductor device for subsequent compression molding; a clamper for application of pressure to the upper and lower molds; and a heater for curing the curable liquid silicone composition by heating. Such compression molding machines are disclosed in Kokai Hei 8-244064, Kokai Hei 11-77733, and Kokai 2000-277551. In view of its simplicity, let us consider, e.g., the compression molding machine disclosed in Kokai 2000-277551.

More specifically, the compression molding machine disclosed in Kokai 2000-277551 makes it possible to place a semiconductor device into a lower mold, supply a curable liquid silicone composition into spaces between the upper mold and the semiconductor device, to clamp the semiconductor device between the upper mold and lower mold, and to subject the curable silicone composition to compression molding. The aforementioned machine has a clamper made in the form of a frame that encloses side faces of the sealing area of the upper mold. The clamper is supported so that it can freely move vertically in the direction of closing-opening of the mold along the aforementioned side faces and so that, when the mold is open, the clamper's lower end face projects from the molding face of the upper mold and is biased to the lower mold. When the lower mold or upper mold is in direct contact with the curable liquid silicone composition, its molding surfaces can be easily coated with a fluoro-resin composition. In particular, the aforementioned compression-molding machine is provided with a device for feeding a film peelable from the mold and the silicone cured body to positions where it can cover the sealing area of the upper mold. In such a machine, sealing of the semiconductor device via the release film protects the silicone cured body from sticking to the molding surface of the mold, reliably closes the sealing area, and prevents formation of burrs.

The aforementioned compression molding machine may also be provided with a feeding mechanism for feeding the film peelable from the mold and silicone cured body to a position where it can cover the molding surface that may support the semiconductor device in the lower mold. Furthermore, the machine is equipped with an air suction mechanism that applies a suction action to the release film on the lower end face of the clamper and to the release film on the inner surface of the sealing area by sucking air from the inner bottom surface of the curable liquid silicone composition sealing area formed by the inner face of the clamper and the molding surface of the upper mold. A provision of the aforementioned suction mechanism reliably holds and seals the release film on the molding surfaces. Alternatively, a suction mechanism for holding the release film may be comprised of air ports open to the lower end face of the clamper and air ports that communicate with an air flow formed in the space between the inner side surface of the clamper and the side surface of the upper mold. Suction action is caused by connecting the aforementioned openings to an air-suction unit. The upper mold may have on its molding surface a cavity that forms an independent molding portion corresponding to a semiconductor-chip placement position on the semiconductor device. Furthermore, the lower mold also may have a cavity that forms an independent molding portion corresponding to a semiconductor-chip placement position on the semiconductor device. The upper mold is moveable in the vertical direction and is supported so that it is urged to the lower mold. An overflow cavity is formed on the molding surface of the lower mold for providing an overflow of the curable liquid silicone composition from the sealing area during sealing of the semiconductor device. A gate or gates, which are communicated to the overflow cavity, and the sealing area may be formed on the clamping surface of the clamper that applies a pressure to the semiconductor device.

When, in a semiconductor sealing operation, a semiconductor device is placed into a lower mold, a curable liquid silicone composition is fed to a space between the upper and lower molds, a film peelable from the mold and the cured silicone body covers the surfaces of the sealing area, the semiconductor device is squeezed between the upper and lower molds together with the curable silicone composition and is sealed. Under these conditions, the clamper that forms a frame that embraces the side surfaces of the sealing area of the upper mold freely moves in the vertical direction along the aforementioned side surfaces, projects with its lower end face below the molding surface of the upper mold, is urged to the lower mold, and seals the periphery of the sealing area; and while the lower and upper molds gradually approach each other, the curable liquid silicone composition fills the sealing area, the molds stop in the closed position of the mold, and the semiconductor device is sealed by the curable silicone composition in the curing cavity of the mold.

FIG. 1 shows main structural parts of the compression-molding machine suitable for carrying out the method of the invention. In this drawing, reference numeral 20 designates a fixed platen, and reference numeral 30 designates a movable platen. Both platens are incorporated into a press. The press may be comprised of an electrically driven press or a hydraulic press capable of performing a sealing operation by driving a movable platen in a vertical direction.

Reference numeral 22 designates a lower base that is fixed to the fixed platen 20, and 23 shows a lower mold that is fixed to the lower base 22. The upper surface of the lower mold 23 has a setting section for placing a semiconductor device 16. The semiconductor device 16 used in the method of the present invention may contain a plurality of semiconductor chips 10 facing upwardly from the lower mold 23. Reference numeral 24 designates a heater arranged in the lower base 22. The heater 24 is intended for heating the lower mold 23, and thus increases a temperature of the semiconductor device 16 supported by the lower mold 23. The machine is provided with lower clamp stoppers 26 that define a position in which the upper and lower molds have to be clamped. The clamp stoppers 26 are installed on the lower base 22.

Reference numeral 32 designates an upper base that is fixed to the movable plate 30. Reference numeral 33 is an upper holder fixed to the upper base 32, and 34 is an upper mold fixed to the upper holder 33. In the method of present embodiment, the semiconductor chips 10 are arranged and sealed on one side of the printed circuit board 12, which is flat. Therefore, in the sealing area the molding face of the upper mold 34 is also made flat. Reference numeral 36 designates a clamper made in the form of a frame that encloses side faces of the upper mold 34 and the upper holder 33. The clamper 36 is supported by the upper base 32 with free vertical movements and is biased towards the lower mold 23 by a spring 37. The molding face of the upper mold 34 is shifted from the end face of the clamper 36, and a sealing area is formed in a closed state of the mold between the inner face of the clamper 36 and the molding face of the upper mold 34. The biasing force of the clamper 36 may be developed by means other than the spring, e.g., by a pneumatic cylinder.

Reference numeral 38 designates a heater that is arranged in the upper base 32 and is intended for heating the upper holder 33 and the upper mold 34, so that the semiconductor device 16 can be heated when the mold is closed; 39 designates upper clamp stoppers that are installed on the upper base 32. The upper clamp stoppers 39 and the lower clamp stoppers 26 are arranged on the side of the upper mold and on the side of the lower mold, respectively, so that in a closed state of the mold their end faces come into mutual contact. When the movable platen 30 is moved downward by the press unit, the upper clamp stoppers 39 contact the lower clamp stopper 26 in the clamping position. Depth of the curable silicone composition molding space is defined by the closed position of the mold. The aforementioned closed or darning position defines the thickness of the sealing curable silicone composition layer formed in the sealing area.

Reference numeral 40a and 40b designate longitudinally arranged release films having width dimensions sufficient to cover the molding faces of the upper mold 34 and the lower mold 23, respectively. The purpose of the release films 40a and 40b is to cover the surfaces of the sealing area in order to prevent direct contact of the curable resin composition with the molding surfaces. The release films 40a and 40b are made of a film-like material, which can be easily peelable from the mold and possesses thermal resistivity with regard to the molding temperatures, permanent mechanical strength, and sufficient softness for changing its shape in order to conform to the recesses and projections on the molding faces of the sealing area. Examples of such materials are films made from polytetrafluoroethylene (PTFE), ethylene-tetrafluoroethylene copolymer (ETFE), tetrafluoroethylene-perfluoropropylene copolymer (FEP), polyvinilidenefluoride (PVDF), or similar fluorine-containing resins; as well as polyethylene-terephthalate (PET), polypropylene (PP), etc.

When in the method of the invention sealing is performed only on the upper side of the printed circuit board 12, the release film 40a is supplied to the upper mold 34 for covering the surface that is to be in contact with the curable liquid silicone composition. By feeding the release film 40b to cover the lower mold 23, it is possible to use compressibility and elasticity of the film for effectively absorbing deviations of the printed circuit board thickness from uniformity and thus to diminish non-uniformities in sealing. It should be noted, however, that the use only of the release film 40a that is located on the side of the upper mold 34 may be sufficient.

Reference numerals 42a and 42b designate feed rollers for the release films 40a and 40b, and reference numerals 44a, 44b designate take-up rollers for the films 40a and 40b, respectively. As shown in the drawing, the feed rollers 42a and 42b and the take-up rollers 44a and 44b are located on opposite sides of the molding machine. The feed roller 42a and the take-up roller 44a for the upper mold 34 are attached to the movable platen. 30; the feed roller 42b and the take-up roller 44b for the lower mold 23 are attached to the fixed platen 20. With this structure, the release films 40a and 40b are moved through the mold from one side of the mold to the opposite side thereof. The feed roller 42a and the take-up roller 44a for the upper mold 34 are vertically moved together with the movable platen 30. Reference numeral 46 designates guide rollers, and 48 stands for static charge removers (ionizers), which remove electric charges on the release films 40a and 40b.

The release film 40a fed to the upper mold 34 is fixed onto the upper mold 34 and held by air suction. The clamper 36 has air ports 36a, which are opened in the lower end face of the clamper 36, and air ports 36b, which are opened in the inner side faces of the clamper 36. The air ports 36a and 36b are communicated to the air suction mechanism locate outside of the mold. A seal ring (O-ring) is provided on the surface of the upper holder 33, which is in sliding contact with the inner surface of the clamper 36. This seal ring prevents leakage of air from the air ports 36b when suction is activated. An air path is formed that flows through the space defined between the side faces of the upper mold 34, side faces of the upper holder 33, and inner faces of the clamper 36, so that the air-suction action from the air port 36b holds the release film 40a on the inner faces of the molding area formed by the upper mold 34 and the clamper 36 and fixes the film to these faces. It should be noted that the suction unit connected to the air ports 36a and 36b is capable of developing not only a suction action but also of supplying a compressed air. When the compressed air is fed via the aforementioned ports, the film 40a is easily peeled from the molding faces.

A method of the invention for sealing the semiconductor device with a curable liquid silicone composition will now be explained. In FIG. 1, the side on the left from a centerline CL shows an open state of the mold, in which the movable platen 30 is in the upper position. In this state, the release films 40a and 40b are newly fed onto surfaces of the mold, and then the semiconductor device 16 is set in the lower mold 23. The semiconductor device 16 is placed onto the release film 40b covering the surface of the lower mold 23.

In FIG. 1, the side on the right from the center line CL shows a state, in which the release film 40a is sucked and fixed to the upper mold 34 and the lower end face of the clamper 36 by actuating the air suction unit. The release film 40a is fed close to the molding surface, and then the air is sucked through the air ports 36a and 36b. This action attracts the release film 40a to the end face of the clamper 36 and fixes it to this end face. At the same time, the release film 40a is sucked along the inner faces of the clamper 36 and the molding face 34b of the upper mold 34. As the release film 40a possesses sufficient softness and flexibility, due to the suction action, it follows the shape of recesses formed on the upper mold 34 and the clamper 36. The end face of the clamper 36 has a plurality of air ports 36a, which are arranged on the aforementioned face circumferentially and with predetermined spaces from each other.

On one hand, the release film 40a is pressed by air suction against the upper mold 34, and at the same time, the curable liquid silicone composition is supplied to the printed circuit board 12 that supports the semiconductor device 16, which has been set in the lower mold 23. Since the amount of the curable liquid silicone composition 50 that has to be supplied corresponds to capacity of the sealing area, it is recommended to supply the composition in metered quantities, e.g., with the use of a dispenser.

Figure 2:
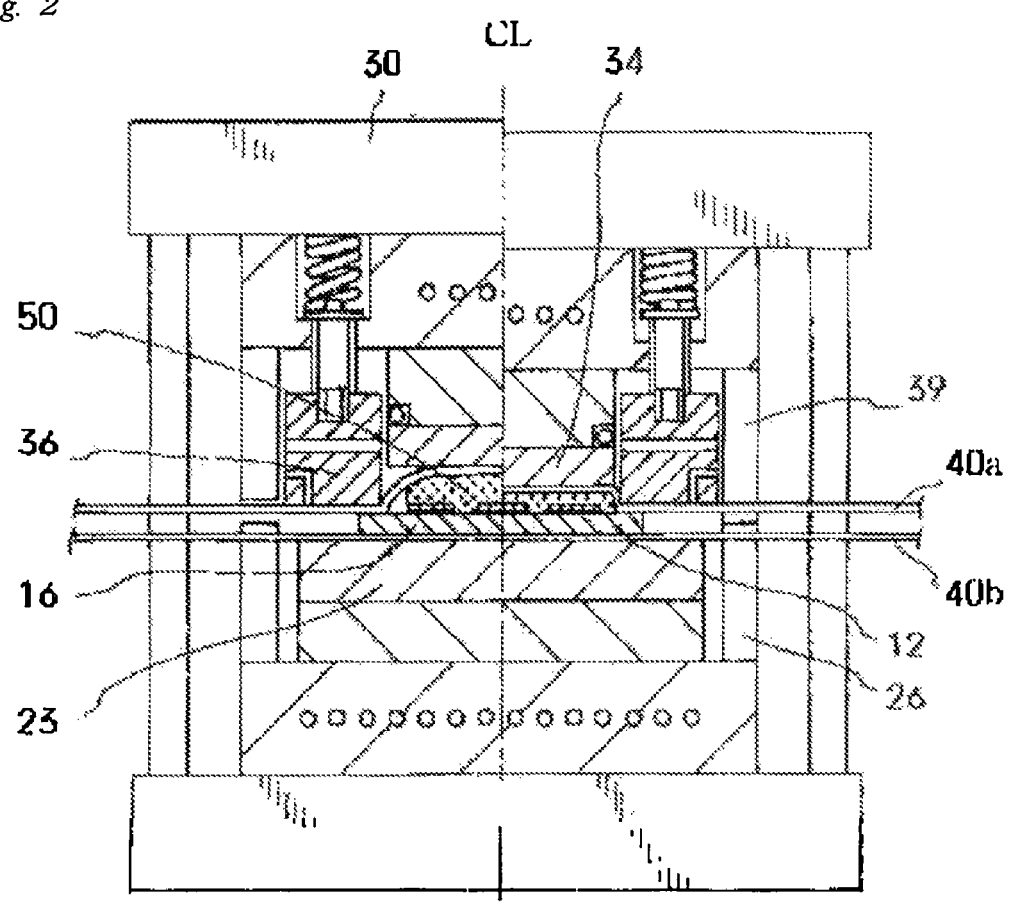
FIG. 2 illustrates sealing conditions of a semiconductor device sealed with the use of a compression molding machine utilized for realization of the method of the invention.

FIG. 2 shows the mold in a closed state when the semiconductor device 16 is clamped between the lower mold 23 and the upper mold 34. A part of the mold located on the left side from the center line CL shows a state, in which the upper mold 34 is moved downward, and the lower end face of the clamper 36 is pressed against the printed circuit board 12 that supports the semiconductor device 16. The upper mold 34 does not reach the complete lowermost position. When the sealing space is closed by the clamper 36, the curable liquid silicone composition 50 begins to fill the sealing space and is compressed by the upper mold 34. In FIG. 2, a part of the mold located on the right side from the centerline CL is shown in a state, in which the upper mold 34 is shifted downward to the clamping position. At the clamping position, the end faces of the lower clamp stoppers 26 come into contact with the end faces of the upper clamper stoppers 39. The clamping force overcomes resistance of the springs 37 and moves the clamper 36 upward, so that the curable liquid silicone composition 50 in the sealing space can have a prescribed thickness.

When the upper mold 34 goes down to the clamping position and the sealing area is adjusted to a prescribed thickness, the curable liquid silicone composition 50 completely fills the sealing area. As shown in FIG. 2, in the side of the machine on the left from the centerline CL, a small gap is formed between the corner portion of the upper mold 34 and the release film 40a. However, when the upper mold 34 descends to the clamping position, the gap between the upper mold 34 and the release film disappears, and the curable liquid silicone composition 50 completely fills the sealing area.

Since the surface of the semiconductor device 16 that has to be sealed is clamped via the release film 40a and the periphery of the sealing area is reliably sealed by the clamper 36, the sealing operation can be carried out without leakage of the curable liquid silicone composition from the sealing area. In the case when wire patterns are formed on the upper face of the printed circuit board 12 with minute steps, the unevenness caused by such steps can be absorbed by the release film 40a, so that no curable liquid silicone composition leaks from the sealing area when the semiconductor device 16 is clamped in the mold. The lower release film 40b that is applied onto the lower surface of the printed circuit board 12 also absorbs, due to its resiliency in the thickness direction, the unevenness of the thickness of the semiconductor device, so that the semiconductor device can be properly sealed.

After the curable liquid silicone composition 50 is heated and cured in the closed state of the mold, the mold is opened, and the semiconductor device sealed with resin is removed from the mold. Since sealing was carried out over the release films 40a and 40b, the cured silicone body does not stick to the molding surfaces, since the release films 40a and 40b are easily peeled from the surfaces of the mold, so that the sealed semiconductor device can be easily extracted from the mold. As described above, separation of the release film 40a can be facilitated by blowing compressed air through the air ports 36a and 36b. After the mold is opened, the feed rollers 42a, 42b and the take-up rollers 44a and 44b are activated, and the release films 40a and 40b are removed from the mold together with the sealed semiconductor device.

Figure 3:
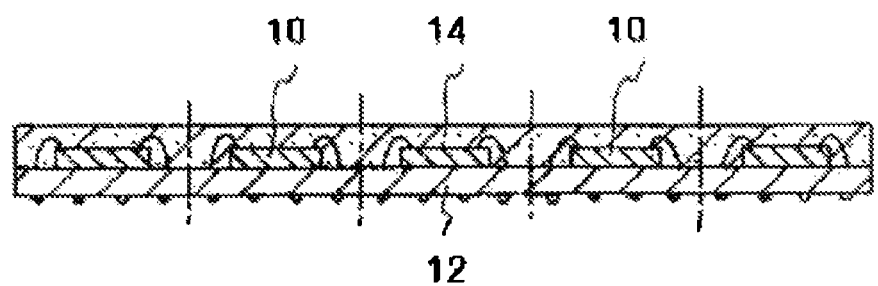
FIG. 3 is a sectional view of a semiconductor device produced in accordance with Practical Examples and Comparative Examples.
Figure 4:
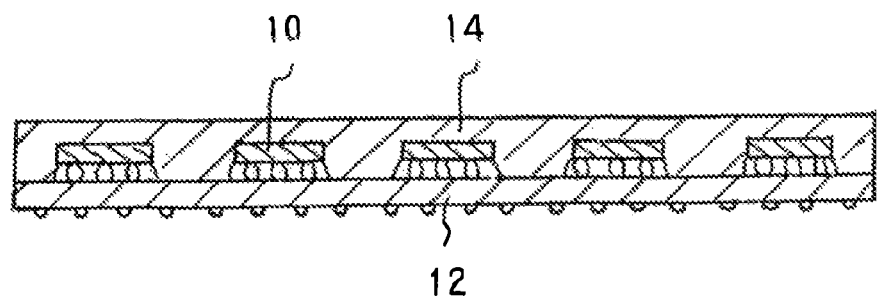
FIG. 4 is a sectional view of a semiconductor device of the invention.
Figure 5:
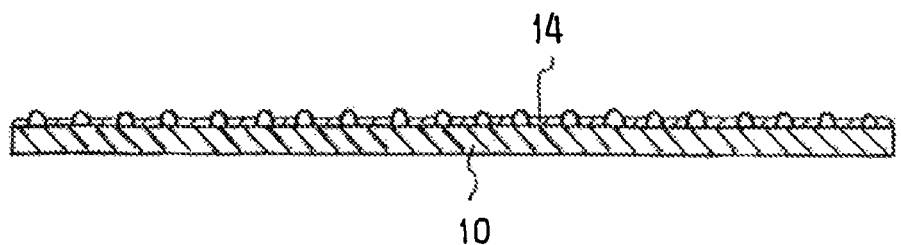
FIG. 5 is another sectional view of a semiconductor device of the invention.

FIGS. 3, 4, and 5 show semiconductor devices sealed by the method of the present invention. Since the upper side of the molded portion is flat, the molding surface of the upper mold 34 also is flat. As shown in the drawings, the intermediate positions between the neighboring semiconductor chips 10 are intended for making a cut through the layer of the sealing resin and the printed circuit board for separating the sealed semiconductor devices into individual pieces. Cutting can be made by means of a dicing saw, laser cutting device, etc.

Figure 6:
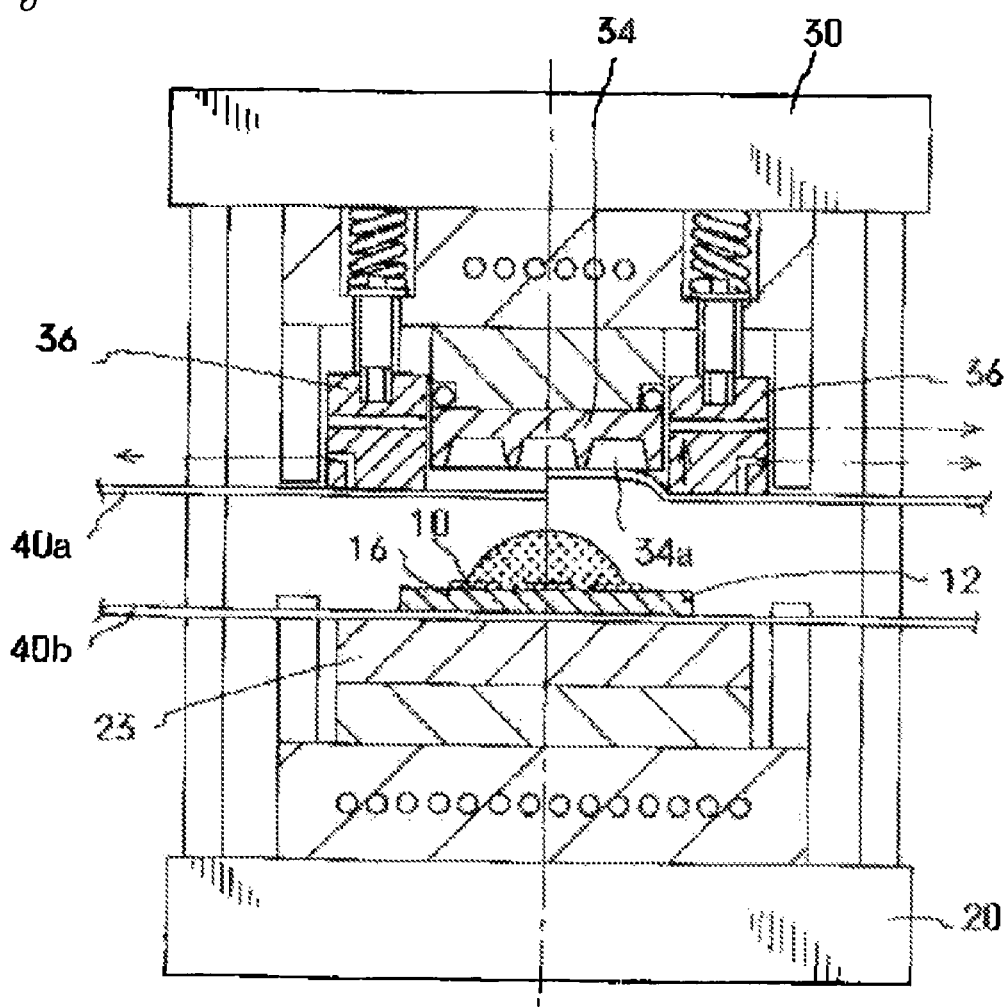
FIG. 6 illustrates another structure of the compression molding machine suitable for realization of the method of the invention.
Figure 7:
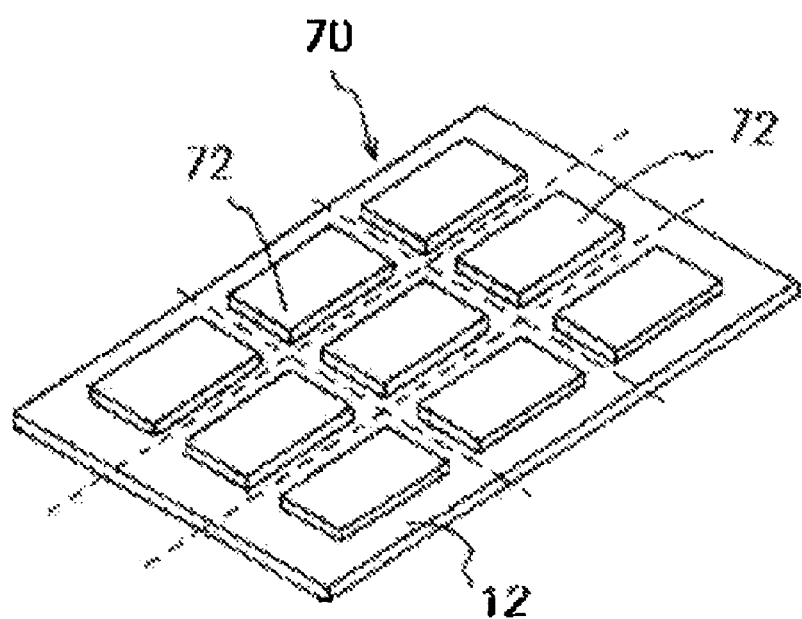
FIG. 7 is an example of a three-dimensional view of a semiconductor device of the invention.

Furthermore, as shown in FIG. 6, the molding face of the upper mold 34 may be provided with cavities 34a that correspond to the mounting positions of individual semiconductor chips 10, so that each chip 10 is sealed individually in its respective cavity 34a. A semiconductor assembly obtained by such a method and sealed by a cured silicone body is shown in FIG. 7. Individually sealed semiconductor devices are obtained by cutting the assembly with neighboring chips 10 in central positions through the layer of the sealing resins and the printed circuit board. Cutting can be performed by means of a dicing saw, laser cutter, or the like.

The curable liquid silicone composition used in the method of the present invention is characterized by the fact that it has viscosity of 90 Pa·s or less at room temperature, and that a time interval from the moment directly after measurement of a torque with a curometer at the molding temperature to the moment when the torque reached 1 kgf·cm is not less than 1 min., while the time interval during which the torque is increased from 1 kgf·cm to 5 kgf·cm is not more than 1 min. If viscosity of the composition exceeds 90 Pa·s at room temperature, this will impair such property of the composition as fillability and may lead to formation of voids. The same will occur if the time interval from the moment directly after measurement of a torque with a curometer at the molding temperature to the moment when the torque reached 1 kgf·cm is shorter than 1 min. On the other hand, if the time interval, during which the torque grows from 1 kgf·cm to 5 kgf·cm, exceeds 1 min, the semiconductor chip and printed circuit board may be either subject to more significant warping and worsening of moldability, or the curable liquid silicone composition will remain partially uncured. Thus, directly after measurement the torque measured at the molding temperature should be less than 1 kgf·cm, while during the curing stage the torque should be 5 kgf·cm or more. In particular, it is preferable to utilize such a curable liquid silicone composition that provides a time interval from the moment directly after measurement of a torque with a curometer at the molding temperature to the moment when the torque reached 1 kgf·cm not less than 1.5 min., and the time interval, during which the torque is increased from 1 kgf·cm to 5 kgf·cm, not more than 0.3 min. There are no special restrictions with regard to the molding temperature, but in general it is preferable to have this temperature in a range from room temperature (25° C.) to 200° C., preferably from 50° C. to 150° C., and even more preferably, from 60° C. to 130° C.

The aforementioned curable liquid silicone composition may be of a hydrosilylation-curable type, condensation-curable type, ultraviolet-ray-curable type, or a radical-polymerization-curable type. The hydrosilylation-curable composition is more preferable from the point of view of controlling curing characteristics. Such a curable liquid silicone composition may be comprised at least of the following components: (A) an organopolysiloxane having at least two alkenyl groups per molecule; (B) an organopolysiloxane having at least two silicon-bonded hydrogen atoms per molecule; (C) a platinum-type catalyst; and (D) a filler. If necessary, the composition may incorporate other optional additives, such as pigments, reaction inhibitors, adhesion-imparting agents, etc.

The curable silicone composition used in the method of the present invention can be used not only as a protective agent for protecting semiconductor chips and wiring, but also as insulating layers for semiconductor chips and printed circuit boards, or as shock-absorbing layers for semiconductor chips and printed circuit boards. There are no special restrictions with regard to the forms of cured silicone bodies, and they can be made in the form of soft rubber, hard rubber, resin, etc. In particular, it is recommended to provide a combined modulus of elasticity not exceeding 1 GPa.

Semiconductor devices that can be sealed with a cured silicone body by the method of the present invention can be exemplified by printed circuit boards that mounts semiconductor chips, semiconductor chips prior to electrical interconnection, or semiconductor wafers prior to cutting into individual semiconductor devices. Examples of such semiconductor devices are shown in FIGS. 3 and 4 that respectively illustrate a semiconductor device that consists of semiconductor chips on a printed circuit board and a device that consists of wire bonded semiconductor chips and a printed circuit board with a plurality of lead wires. In the embodiment of FIG. 3, the semiconductor devices are formed by wire bonding the semiconductor chips 10 with bonding wires made from gold or aluminum after the chips are secured by a die-bond on a printed circuit board 12 made from a polyimide resin, epoxy resin, BT resin, or ceramic. In the embodiment of a semiconductor device of FIG. 4, semiconductor chips are electrically interconnected with the printed circuit board via the use of solder balls or conductive bumps. For reinforcement, the solder balls or conductive bumps may incorporate an underfill agent. Such an underfill agent may be comprised of a curable epoxy resin composition or a curable silicone composition. In the semiconductor devices of FIGS. 3 and 4, in order to connect the semiconductor devices after they have been sealed to other printed circuit boards, the printed circuit board 12 that supports these devices is provided, on the side opposite to the chips, with external electrodes, e.g., solder balls, formed on the back side of the printed circuit board. If a device consists of a plurality of simultaneously sealed semiconductor chips arranged on the upper side of the board, the package can be divided into individual sealed semiconductor devices by sawing or by punching. FIG. 5 shows an example of a wafer level Chip Scale Package, namely, CSP.

When during sealing of a semiconductor device with a cured silicone body by the method of the invention in the above-described compression molding machine the curable liquid silicone composition comes into direct contact with the mold, it leaves on the molding surfaces of the mold a slimy substance that adheres to these surfaces. Therefore, it is recommended to perform compression sealing via the aforementioned release films. The use of such films allows continuous sealing with resin, extends intervals between mold-cleaning operations, and thus increases production efficiency.

There are no special restrictions with regard to compression-molding conditions. However, for decreasing stress in circuit printed boards and semiconductor chips, it is recommended to maintain the heating temperature within the range of from room temperature (25° C.) to 200° C., preferably from 50° C. to 150° C., and even more preferably, from 60° C. to 130° C. Furthermore, preheating of the mold may improve a compression-molding cycle time. Curable liquid silicone compositions used in the method of the invention may be of various types. However, spreading of the curable liquid silicone composition can be controlled by applying the composition dropwise onto a printed circuit board preheated by the heat from the lower mold.

The following description will relate to a semiconductor device of the invention. A sealed semiconductor device of the invention is the one produced by the above-described method of the present invention. Since the sealing material of the semiconductor device is free of voids, it maintains an attractive appearance and is not subject to loss of moisture-resistant properties. Furthermore, since such a device can be produced with accurate control of a sealing resin thickness, it is suitable for miniaturization and thinning of electronic instruments.

EXAMPLES

The semiconductor devices of the invention and method of their manufacturing will be further described with reference to practical and comparative examples. The curable liquid silicone compositions and the semiconductor devices were evaluated with the use of the criteria given below.

[Viscosity]

Viscosity of silicone rubber compositions at room temperature (25° C.) was measured by an E-type rotary viscometer (the product of Tokimec Inc.; cone: 3°, diameter: 28 mm)

[Curability by Curometer]

Curability of curable liquid silicone compositions was determined with the use of a curometer (the product of Orientec Co., Ltd, Curometer Model III-NPS) by measuring torques (kgf·cm) and time intervals (min.) at various molding temperatures (70° C. and 120° C.). In each measurement, 5 ml of the tested curable liquid silicone composition were placed into the lower mold, and measurement initiated at the moment of closing of the upper mold. Measurements were carried out with the use of the R-type die for rubber, the angular amplitude was 3°, the rotation frequency was 100 revolutions/min., and the minimum value of the torque range was 10 kgf·cm.

[Composite Modulus of Elasticity]

The curable liquid silicone compositions were subjected to compression molding for 5 min. at 120° C. under load of 30 kgf/cm$^2$ and then the product was again heat-treated at 120° C. for 1 hour in an oven. The composite modulus of elasticity was measured with the use of an instrument for measuring viscoelasticity (shear frequency 1 Hz, strain rate 0.5%).

The following criteria were used for evaluating the molded products.

[Appearance]

Appearance of semiconductors sealed with cured bodies of the silicone resin and epoxy resin was evaluated in term of thickness difference between the central part and peripheral portions of the products. The following designations were used for this evaluation: the difference does not exceed 5%—○; the difference is not less than 5% but does not exceed 10%—Δ; the difference is not less than 10% —X.

[Fillability]

The surfaces of semiconductor devices sealed with cured bodies of the silicone and epoxy resin were visually observed and evaluated in accordance with the following criteria: filling is uniform, voids are absent—○; some voids and incompletely filled areas are present—X.

[Warping]

Warping was determined by rigidly fixing one long side of a semiconductor device assembly sealed by a silicone or epoxy resin, prior to cutting it into individual semiconductor devices, and measuring the height of the other long side over the position of the fixed side.

Curable liquid silicone rubber compositions used in practical examples of the invention and in comparative examples had characteristics shown in Table 1.

TABLE 1

| | | Curable liquid silicone rubber compositions | | | |
|---|---|---|---|---|---|
| | | (A) | (B) | (C) | (D) |
| Viscosity | (mPa · s) | 85 | 58 | 140 | 93 |
| Appearance | | Black color | Black color | Black color | Black color |
| Composite modulus of elasticity of the silicone rubber | (×10$^7$ dyne/cm$^2$) | 6.7 | 3.7 | 4.0 | 4.0 |
| Curing properties | | | | | |
| 70° C. Time till reaching torque of 1 kgf · cm | (min.) | 30 | 25 | 2.2 | 3.1 |
| Time during which torque is increased from 1 kgf · cm to 5 kgf · cm | (min.) | 60 | 60 | 5.8 | 3.1 |
| 120° C. Time till reaching torque of 1 kgf · cm | (min.) | 2 | 1.8 | 0.2 | 0.2 |
| Time during which torque is increased from 1 kgf · cm to 5 kgf · cm | (min.) | 0.2 | 0.1 | 0.2 | 0.4 |

Practical Example 1

In the present practical example, a semiconductor device of the type shown in FIG. 3 was used. More specifically, (8 mm×14 mm) semiconductor chips 10 were fixed to a (70 mm×160 mm) printed circuit board made from a BT resin via a 35 μm-thick epoxy-resin die-bond agent layer. The printed circuit board was comprised of a laminated structure formed by applying an 18 μm-thick copper foil via an epoxy-resin adhesive layer having a 17 μm thickness onto one side of a 200 μm-thick BT resin film. Circuit patterns were then made from the aforementioned foil. Portions required for wire bonding of the circuit patterns were removed. The circuit patterns and bumps (not shown) of the semiconductor chips were electrically interconnected and wire bonded via 48 gold bonding wires. In total, 54 semiconductor chips divided into 3 blocks of 18 chips in each were secured to the printed circuit board and formed into respective wire patterns by wire bonding.

The hydrosilylation-curable liquid silicone rubber composition (A) was applied at room temperature in amounts of 20 g to predetermined places on a printed circuit board 12 made from the BT resin for supporting semiconductor chips 10, and then the printed circuit board was placed into the lower mold of a compression molding machine of the type shown in FIG. 1. The upper and lower molds of the aforementioned molding machine were closed. (In order to protect the molding surfaces from contamination and facilitate removal of the silicone rubber from the mold, the inner surface of the upper mold was coated with a release film made from a tetrafluoroethylene resin, and the film was pressed to the sealing surfaces by air suction.) Compression molding was carried out in a clamped state of the printed circuit board during 3 minutes at 120° C. under a load of 35 kgf/cm$^2$. Following this, the semiconductor device sealed in the silicone rubber was removed from the mold and heat treated for 1 hour in an oven at 120° C. As a result, a sealed semiconductor device having a 600 μm-thick silicone rubber layer on the surfaces of semiconductor chips was produced. Characteristics of the obtained semiconductor devices are shown in Table 2.

Practical Example 2

A semiconductor device was prepared in the same manner as in Practical Example 1 with the exception that a hydrosilylation-curable liquid silicone rubber composition (B) was used instead of the hydrosilylation-curable liquid silicone rubber composition (A). Characteristics of the obtained semiconductor devices are shown in Table 2.

Comparative Example 1

A semiconductor device was prepared in the same manner as in Practical Example 1 with the exception that a hydrosilylation-curable liquid silicone rubber composition (C) was used instead of the hydrosilylation-curable liquid silicone rubber composition (A) and that compression molding was carried out during 15 min. at 70° C. and with the load of 35 kgf/cm$^2$. Characteristics of the obtained semiconductor devices are shown in Table 2.

Comparative Example 2

A semiconductor device was prepared in the same manner as in Comparative Example 1 with the exception that a hydrosilylation-curable liquid silicone rubber composition (D) was used instead of the hydrosilylation-curable liquid silicone rubber composition (C). Characteristics of the obtained semiconductor devices are shown in Table 2.

Comparative Example 3

A semiconductor device was prepared in the same manner as in Comparative Example 1 with the exception that a hydrosilylation-curable liquid silicone rubber composition (C) was used instead the hydrosilylation-curable liquid silicone rubber composition (A) and that compression molding was carried out during 3 min. at 120° C. and with the load of 50 kgf/cm$^2$. Characteristics of the obtained semiconductor devices are shown in Table 2.

Comparative Example 4

A semiconductor device was prepared in the same manner as in Comparative Example 3 with the exception that a hydrosilylation-curable liquid silicone rubber composition (D) was used instead the hydrosilylation-curable liquid silicone rubber composition (C). Characteristics of the obtained semiconductor devices are shown in Table 2.

TABLE 2

| Character-istics | Pr. Ex. of the Invention | | Comparative Examples | | | |
|---|---|---|---|---|---|---|
| | 1 | 2 | 1 | 2 | 3 | 4 |
| Appearance | ◯ | ◯ | X | X | Δ | Δ |
| Fillability | ◯ | ◯ | X | X | X | X |
| Warping | 1 mm or less | 1 mm or less | 1 mm or less | 1 mm or less | 2 mm | 2 mm |

INDUSTRIAL APPLICABILITY

The method of the invention provides efficient manufacturing of sealed semiconductor devices, prevents formation of voids in the sealing material, allows precise control of thickness of the cured silicone bodies that seal the devices, protects the bonding wires from disconnection and undesired contact, and reduces warping of semiconductor chips and printed-circuit boards. In particular, the invention provides such a method of manufacturing sealed semiconductor devices that allows compression molding of a curable silicone composition at the relatively low temperature required for reducing warping of semiconductor chips and printed-circuit boards. Therefore, the method of the invention is suitable for miniaturization and thinning of electronic instruments.

The invention claimed is:

1. A method of manufacturing a semiconductor device sealed in a cured silicone body by placing an unsealed semiconductor device into a mold and subjecting a curable liquid silicone composition that fills the spaces between the mold and the unsealed semiconductor device to compression molding under a predetermined molding temperature, wherein said curable liquid silicone composition has viscosity of 90 Pa·s or less at room temperature, and wherein a time interval from the moment directly after measurement of a torque with a curometer at the molding temperature to the moment when the torque reached 1 kgf·cm is not less than 1 min., while the time interval during which the torque grows from 1 kgf·cm to 5 kgf·cm is not more than 1 min.

2. The method of claim 1, wherein the curable liquid silicone composition is a hydrosilylation-curable liquid silicone composition.

3. The method of claim 1, wherein the curable liquid silicone composition, when cured, forms a cured silicone body with a composite modulus of elasticity of 1 GPa or less.

4. The method of claim 1, wherein after the semiconductor device has been placed into a lower mold and the curable liquid silicone composition has been fed into a space between an upper mold and the unsealed semiconductor device, the unsealed semiconductor device is clamped between the upper mold and the lower mold, and the curable liquid silicone composition is subjected to compression molding.

5. The method of claim 1, wherein at least two semiconductor devices are sealed, and then the obtained sealed assembly is cut into separate sealed semiconductor devices.

6. The method of claim 1, wherein the semiconductor device comprises semiconductor chips on a printed circuit board, the chips being electrically connected via bonding wires.

7. The method of claim 6, wherein the curable liquid silicone composition is applied onto the surface that supports semiconductor chips of the printed circuit board, and the connection between the semiconductor chips and the bonding wires is sealed with a cured silicone body.

8. The method of claim 1, wherein a release film is applied to the inner surface of the mold.

9. The method of claim 8, wherein the release film is held against the inner surface of the mold by air suction.

* * * * *